United States Patent
Karlsson et al.

(10) Patent No.: US 7,020,005 B2
(45) Date of Patent: Mar. 28, 2006

(54) NON-SWITCHING PRE- AND POST-DISTURB COMPENSATIONAL PULSES

(75) Inventors: Christer Karlsson, Linköping (SE); Per Hamberg, Kisa (SE); Staffan Björklid, Linköping (SE); Michael O. Thompson, Ithaca, NY (US); Richard Womack, Albuquerque, NM (US)

(73) Assignee: Thin Film Electronics, ASA, Oslo (NO)

( * ) Notice: Subject to any disclaimer, the term of this patent is extended or adjusted under 35 U.S.C. 154(b) by 0 days.

(21) Appl. No.: 11/053,905

(22) Filed: Feb. 10, 2005

(65) Prior Publication Data

US 2005/0248979 A1    Nov. 10, 2005

(30) Foreign Application Priority Data

Feb. 13, 2004   (NO) ................. 20040644

(51) Int. Cl.
*G11C 11/22*    (2006.01)
(52) U.S. Cl. .................. 365/145; 365/185.19
(58) Field of Classification Search ........... 365/145, 365/185.19, 189.01
See application file for complete search history.

(56) References Cited

U.S. PATENT DOCUMENTS

| | | | |
|---|---|---|---|
| 3,002,182 A | 9/1961 | Anderson | |
| 6,856,534 B1 * | 2/2005 | Rodriguez et al. | 365/145 |
| 6,937,500 B1 * | 8/2005 | Gudesen et al. | 365/145 |
| 6,950,330 B1 * | 9/2005 | Thompson et al. | 365/145 |
| 2002/0141225 A1 | 10/2002 | Nakamura | |
| 2003/0179610 A1 | 9/2003 | Sakai | |

FOREIGN PATENT DOCUMENTS

WO    WO-02/05287 A1    1/2002

* cited by examiner

*Primary Examiner*—Son T. Dinh
(74) *Attorney, Agent, or Firm*—Birch, Stewart, Kolasch & Birch, LLP

(57) ABSTRACT

A method of operating a passive matrix addressable ferroelectric device having a voltage pulse protocol with a pre-disturb and post-disturb cycle before and after a disturb generating operation cycle respectively in order to minimize the effect of disturb voltage on non-addressed memory cells, when such voltages are generated thereto in the operation cycle when It is applied for either a write or read operation.

15 Claims, 13 Drawing Sheets

US 7,020,005 B2

NON-SWITCHING PRE- AND POST-DISTURB COMPENSATIONAL PULSES

FIELD OF THE INVENTION

The present invention concerns a method for operating a ferroelectric or electret memory employing passive matrix addressing according to the introduction of claim 1.

DESCRIPTION OF THE RELATED PRIOR ART

Passive matrix addressed memory as referred to above is well known in the prior art. As shown in FIG. 1, it is typically implemented by letting two sets of parallel electrodes cross each other, normally in an orthogonal fashion, in order to create a matrix of cross-points that can be individually accessed electrically by selective excitation of the appropriate electrodes from the edge of the matrix. In the following, the horizontal and vertical electrodes in. FIG. 1 shall be referred to as "word lines" and "bit lines", respectively. A layer of ferroelectric or electret material is provided between or at the electrode sets such that capacitor-like structures, functioning as memory cells, are formed in the material between or at the crossings of the electrodes. The use of ferroelectrics or electrets as memory materials confers non-volatility upon the memory devices in question, due to their ability to retain a logic state represented by a polarization state in the absence of applied voltages or currents to the memory device. When applying potential differences between two electrodes, the ferroelectric or electret material in the cell is subjected to an electric field that generates a polarization response generally tracing a hysteresis curve or a portion thereof. A relevant hysteresis curve is showed in FIG. 2 where the corresponding voltage is shown instead of the electric field for reasons of convenience. By exceeding the coercive field ($E_c$), or the corresponding coercive voltage ($V_c$) in either direction, for example by applying a switch voltage ($V_s$) over a memory cell, the memory cell can be switched and left in a desired logic state. Passive addressing leads to simplicity of manufacture and a high density of memory cells compared to active addressing wherein active elements such as transistors are used to disconnect a memory cell from the rest of the matrix when appropriate. The typical way of reading a memory cell of the relevant type in a passive matrix is destructive and involves subjecting one cell per bit line to a predetermined voltage sufficient to switch polarization state while sensing released charges on the bit line, typically by using a sense amplifier connected to the bit line. Write-back is required to retain the logic state after the destructive readout.

The amount and type of stimulus subjected to a memory cell in a passive matrix-addressable device depends on how the voltages are managed on word lines and bit lines in the matrix. The time-coordinated control of voltages, or electric potentials, on word lines and bit lines, sometimes called the "timing diagram" or the "voltage pulse protocol" or simply the "pulse protocol", is important for efficient usage of any passive matrix addressable device. The pulse protocol defines electrode voltages to be applied during certain operation cycles such that only cells being addressed may receive switching voltages. There are a number of pulse protocols proposed in prior art, some to mention in particular are disclosed in the present applicants granted Norwegian patents no. 312699 and 314524.

In passive matrix addressing, an arbitrary bit line electrode is common for all word lines and an arbitrary word line electrode is common for all bit lines. This implies that unaddressed cells may get affected when voltage pulses are applied to addressed cells in order to alter their polarization state. Unwanted voltage pulses occurring in a passive matrix, typically on non-addressed cells, are normally referred to as "disturb voltages", "disturb voltage pulses" or simply "disturb pulses". The phenomenon in general, often named "disturb", is known for passive matrix addressing and give rise to a number of negative side effects. When selected cells in a passive matrix of the relevant type are subjected to a switch voltage $V_s$ by excitation of electrode potentials, fractional voltages will typically form on non-selected cells at the same time. In most situations it will be these fractional voltages that contributes the most to the disturb voltage perceived by a cell. In the following, "disturb voltage" often will be used as a synonym to "fractional voltage". In an ideal situation, unaddressed cells shall be unaffected when other cells are addressed and selected to receive a switch voltage. However, since it is hard to avoid disturb/fractional voltages due to the nature of passive matrices, one important aspect in passive matrix addressing is reduction of negative effects due to disturb voltages, for example by keeping the disturb voltages at lowest possible levels. The Norwegian patent no. 314524 discloses a pulse protocol that results in no disturb voltages on unaddressed cells during concurrent readout of all cells along a word line.

One negative effect of disturb voltages is partial switching of unaddressed cells. Partial switching pertains to loss of remanent polarization when a memory cell is subjected to an electric filed below the coercive field. A disturb voltage may for example partially switch a memory cell in the direction given by the polarity of the disturb pulse, thus reducing the net polarization in the cell. Consecutive application of voltage pulses below the coercive voltage, corresponding to the coercive field, may therefore diminish the polarization set in the memory cell until confident readout cannot be made.

In combination with the phenomenon of "imprint" a single disturb pulse may even, under certain circumstances, result in an accidental switch of polarization state in a memory cell. Imprint may arise in memory cells that remain in a certain polarization state for a period of time. It manifests itself as a change in the switching properties whereby the hysteresis curve shifts so as to increase the coercive field perceived when switching the polarization direction to that opposite to the direction where the material has resided during the imprinting period. In other words, the polarization has a tendency to become stuck in the direction where it has been allowed to rest for some time. If a pulse of magnitude $V_c$ or above is applied to switch an imprinted cell, that cell may for a period of time be sensitive to even small voltages in the former imprint direction, e.g. a disturb voltage. A disturb pulse may therefore accidentally switch the cell back in the imprint direction if the imprinted cell does not first get time to settle in the new direction.

Not only may a disturb pulse accidentally switch a memory cell, disturb voltages also cause so called "sneak" currents which for example may mask charges to be sensed when reading an addressed cell. The problem of disturb, in particular for the sneak case, is aggravated in large passive matrix structures with many disturbed memory cells per addressed cell. Another closely related problem is relaxation currents, i.e. currents remaining in the matrix after the application of a voltage pulse and that decay relatively slowly compared to the direct charge release when applying a voltage over a cell. Relaxation currents may linger and interfere with consecutive operations and it is therefore often required to design regular wait-intervals between operations to reduce interference of lingering sneak/relaxation currents, which in turn results in reduced data rate.

In U.S. Pat. No. 3,002,182 (John R. Anderson), a pulse protocol is presented which optionally may have what is called additional "bidirectional", "disturbance compensating" pulses added on "column electrodes" (corresponding to bit lines) subsequent to a "store" operation (corresponding to a write operation), claiming that the "effect of disturbing pulses is virtually eliminated" on what would correspond to what here have been defined as unaddressed cells. The problem addressed by Anderson is the "effect of disturbing" pulses, which is understood to be the loss of remanent polarization due to partial switching. However, no decent explanation is given on the "disturbing compensating pulses" which appears a large degree to rely on pure empirical experiences. The "disturbing compensating pulses" seem to be targeted only for the specific pulse protocol disclosed in Anderson's application. Further, no description is provided on the nature of the "bidirectional" pulses, nothing is mentioned about reduction or compensation of sneak/relaxation currents and no attention is paid to imprint effects in combination with disturbing pulses.

SUMMARY OF THE INVENTION

Prior art pulse protocols have primarily focused on minimizing disturb voltages. No attention has been paid to reducing effects of sneak/relaxation currents. Some solutions have been exemplified for a specific pulse protocol to remedy problems with remnant polarization loss due to partial switching, but without taking precautions on the risk of accidental switching due to imprint and without seeking opportunities to increase data rate. Hence the main object of the invention is to provide new efficient ways of voltage control, thereby reducing influence of sneak/relaxation currents in readout values and allowing for higher data rates while at the same time reducing effects of partial switching and accidental switching due to imprint.

The above object as well as further advantages and features are realized with a method according to the invention as disclosed in the characterizing portion of independent claim 1.

BRIEF DESCRIPTION OF THE DRAWINGS

The invention shall be better understood with reference to the appended drawing figures, wherein.

DETAILED DESCRIPTION OF PREFERERED EMBODIMENTS

The present invention claims applicability in a generic set of passive matrix-pulse protocols. The pulse protocols of interest for the present invention will therefore first be described in a generic fashion before giving more detailed descriptions of preferred embodiments.

First some definitions and explanations will be given on designations and definitions used in the application.

Figure 1:
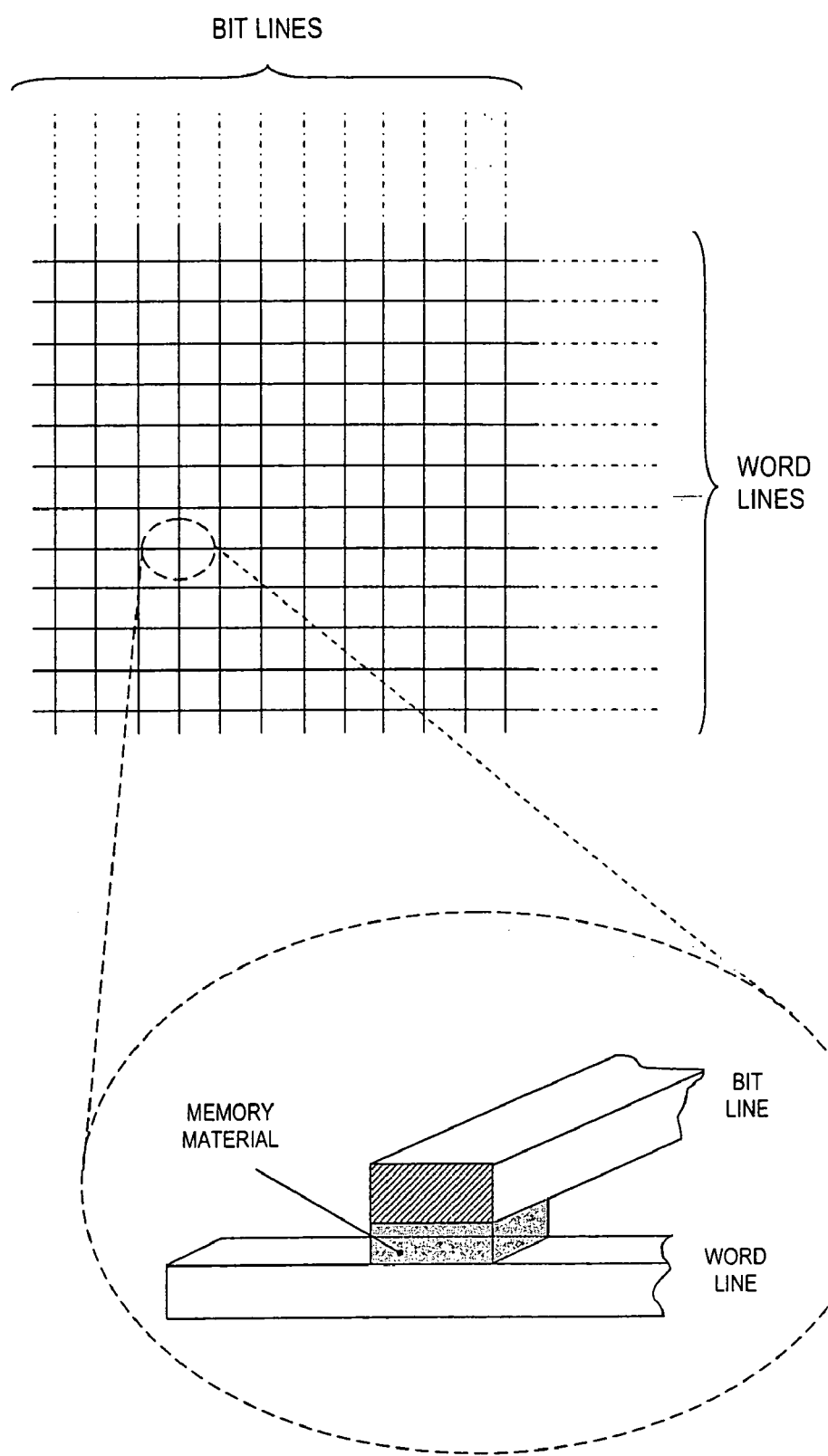
FIG. 1 shows an example of a passive matrix memory with memory material located between and in the intersections, FIG. 2 a principle drawing of a hysteresis curve for a polarizable material, e.g. a ferroelectric, FIG. 3 electrode potential levels for the non-existing solution to the problem of simultaneously switching addressed cells in a passive matrix to opposite polarization states, FIG. 4 relations between electrode potentials in a passive matrix during application of a switching voltage to selected addressed cells, FIG. 5a a closed loop in the passive matrix during an addressing operation including acronyms and location of word lines, bit lines and memory cells at their intersections, FIG. 5b cell voltages related to electrode potentials for a closed loop in the passive matrix during a disturb generating operation cycle, FIG. 6 electrode potential levels during a non-switching pre- and/or post-disturb cycle, FIG. 7 cell voltages related to electrode potentials for a closed loop in the passive matrix during a pre- and/or post-disturb cycle, FIG. 8 electrode potential levels and resulting cell voltages for a pulse protocol with a single pulse pre-disturb cycle, FIG. 9 electrode potential levels during a non-switching pre- and/or post-disturb cycle using the same potential on addressed word lines and unaddressed word lines, FIG. 10 electrode potential levels and resulting cell voltages for a pulse protocol with a single pulse pre-disturb cycle and a single pulse post-disturb cycle, FIG. 11 electrode potential levels and resulting cell voltages for a pulse protocol with a single pulse pre-disturb cycle and a single pulse post-disturb cycle with time separation, FIG. 12 electrode potential levels and resulting cell voltages for a pulse protocol with a single pulse pre-disturb cycle and two-pulse post-disturb cycle with alternating and decreasing pulses, FIG. 13 electrode potential levels and resulting cell voltages for a pulse protocol with a single pulse pre-disturb cycle and a single pulse post-disturb cycle with a single polarity end-pulse.
Figure 2:
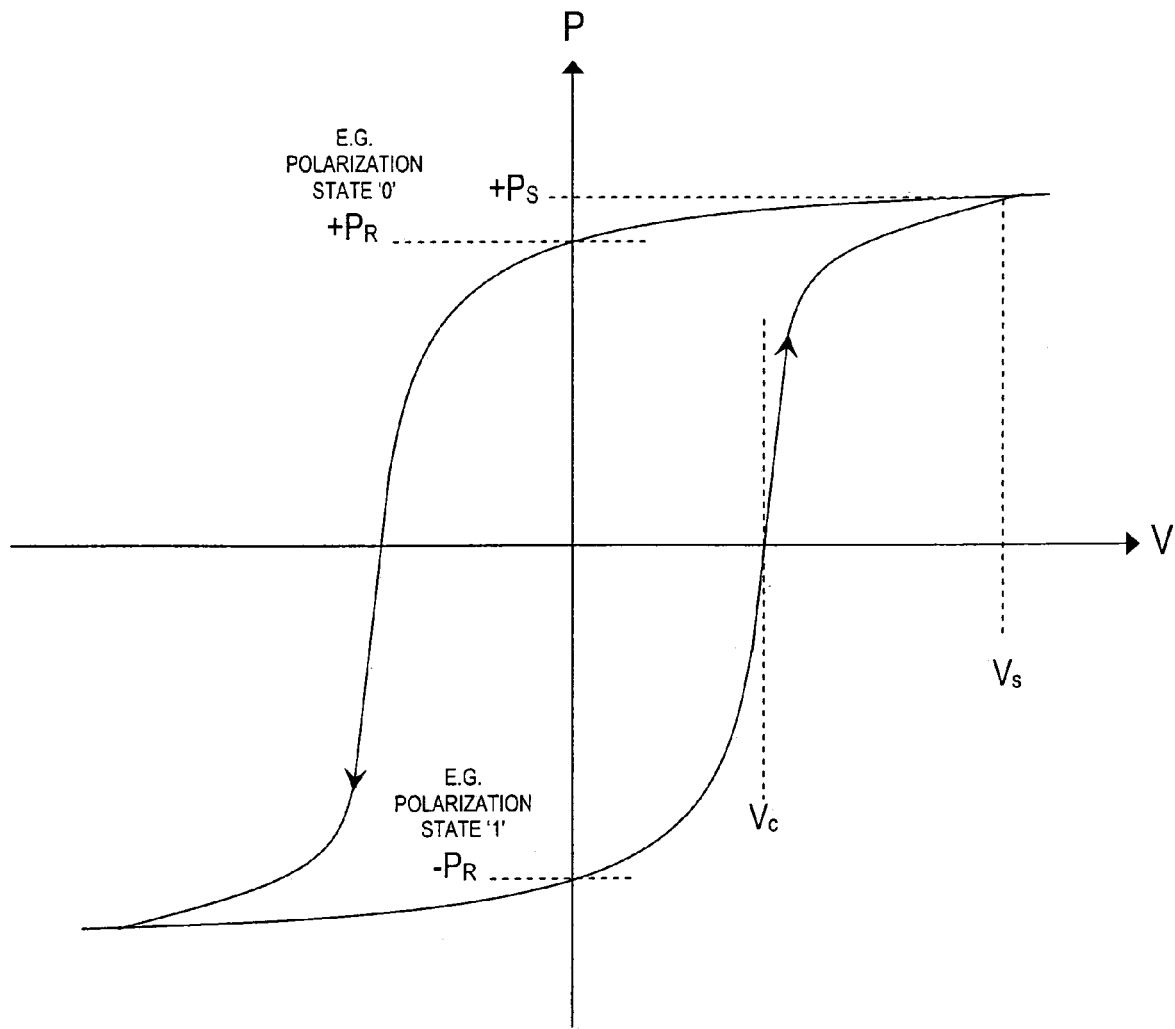

Coercive field ($E_c$), and the corresponding coercive voltage ($V_c$), as shown in the hysteresis curve of FIG. 2 is not necessarily constant. A hysteresis curve does not for example show time dependency and most of the relevant materials show different hysteresis behaviour depending on the duration of the voltage exposure and temperature, i.e. the curve is not only depending on the voltage level. Thus, in the context of this application, the coercive voltage ($V_c$) should be seen as a voltage level that after application for a predetermined period of time over the memory material will result in that half of the dipoles are polarized in the direction given by the applied voltage polarity.

Switching voltage ($V_s$) should correspondingly be seen as a voltage level that after application for a predetermined period of time will result in that a majority of the dipoles will remain polarized in the direction given by the applied voltage polarity even after there is no longer a voltage applied. The switching voltage $V_s$ will always be larger than or equal to $V_c$. An equal $V_c$ and $V_s$ corresponds to a square shaped hysteresis curve, which typically is a theoretical situation.

Addressing operation is an operation on addressed cells, i.e. a cell or a group of cells for which it is an specific intention to reveal, change or alter the polarization state in a predetermined manner, e.g. by reading or writing. A voltage pulse protocol (or a timing diagram) typically defines an addressing operation in terms of voltages applied to bit lines and word lines as a function of time.

Operation cycle is a part of a voltage pulse protocol, and is for example a read cycle or write cycle during which electrode voltages correspond to a specific and predefined set of word line potentials and bit line potentials that result in proper cell voltages for the corresponding addressing operation.

Addressed cells (Ax and Ay) are the cells targeted for an addressing operation, e.g. read and write. Typically addressed cells include all cells along an addressed word line (AWL) in so-called full row/word addressing. Selected addressed cells (Ax) are a sub-set of the addressed cells viz. the addressed cells that intentionally receive a switch voltage pulse for switching polarization state from Y to X. Non-selected addressed cells (Ay) are the other sub-set of the addressed cells viz. addressed cells that intentionally receive a voltage pulse for not switching polarizations state, i.e. for maintaining polarization state Y.

Unaddressed cells (Dx and Dy) are all other cells but the addressed cells in the passive matrix.

Addressed word lines (AWL) are the word lines that intersect addressed cells. In so-called full row/word addressing there is only one addressed word line at the same time in an addressing operation.

Unaddressed word lines (UWL) are the word lines that only intersect unaddressed cells.

Addressed bit lines (BLx and BLy) are the bit lines that intersect addressed cells of type Ax and Ay respectively.

In the majority of pulse protocols of today that is relevant for this application, the generic principle for reading the polarization state of a cell is to apply a known switching voltage $V_s$ over the cell, whereby the cell is switched to a known polarization state while released charges are detected. A relatively large amount of released charges indicates that the cell has changed polarization state, while a relatively small amount of charges indicates that the cell already was set to the polarization state in the direction of the switch voltage. In a passive matrix this is typically accomplished by letting the cell that shall be read be the only cell in its bit line to receive a switching voltage $V_s$ while charges are sensed using a sense amplifier connected to the bit line. Typically the same predefined polarity for the $V_s$ pulse is used for all read operations and typically one cell per bit line is read in parallel for reasons of efficiency. Often all cells along a word line are read concurrently in a so called "full row read" or "full word read". The result after reading is that all cells end up in the same predefined polarization state, i.e. the described read method is destructive since any stored information will be removed from the read cells. There is also non-destructive read where the polarization state is revealed without necessarily switching the cell. The drawback with non-destructive methods is that the resulting signal typically is too small and weak to provide reliable detection of the polarization state, at least in practical applications of today. Destructive read methods is therefore the currently dominating method. If it is desired to keep the destructively read information stored in the passive matrix, it is required to let the read operation be followed by an operation that rewrites the information.

During an addressing operation in a passive matrix, e.g. when reading or writing cells at a certain location in the matrix by application of a Vs voltage over those cells; disturbing/fractional voltages may be formed over non-addressed cells. The disturbing voltages may be a particular problem in the case of destructive read when relatively large cells voltages are used. However, in the case of a full row read, it is possible to avoid disturbing voltages by using a full row read pulse protocol as disclosed in the present applicants granted Norwegian patent no. 312699 where all electrodes are kept at the same potential level except for the addressed word line which differs in potential by $V_s$.

In writing it is typically desired to set each of the addressed cells to either one of two possible and opposite polarization states as shown in the hysteresis curve in FIG. 2. A cell may be switched between the polarization states by application of pulses with magnitude $V_s$ of opposite polarities. In a corresponding way as in case of full row read, it may seem tempting trying to write a whole word line at once by concurrent application of $+V_s$ pulses and $-V_s$ pulses to selected cells along the word line. However, this is not possible in practice because of disturbing voltages that will form on non-addressed cells. The situation in terms of voltages and potentials may be described by the following equations:

$$V(Ay)=\Phi(BLy)-\Phi(AWL)=-V_s \quad (1)$$

$$V(Ax)=\Phi(BLx)-\Phi(AWL)=+V_s \quad (2)$$

$$V(Dy)=\Phi(BLy)-\Phi(UWL)<|V_c| \quad (3)$$

$$V(Dx)=\Phi(BLx)-\Phi(UWL)<|V_c|, \quad (4)$$

where $|V_c|<|V_s|$ and $\Phi \geq 0$.

Referring to equations (1)–(4), the voltage over an addressed cell that shall be written and set to polarization state Y is given by V(Ay) and the voltage over an addressed cell that is desired to write and set to polarization state X is given by V(Ax). At the same time as the voltages over addressed cells shall be equal to switch voltages ($V_s$) of opposite polarity, any of the non-addressed cells along the bit lines shared with the addressed cells, must not be subjected to a switching voltage, i.e. voltages over Dy and Dx cells must be below the coercive voltage $V_c$ corresponding to the coercive field of the material in the cell.

Figure 3:
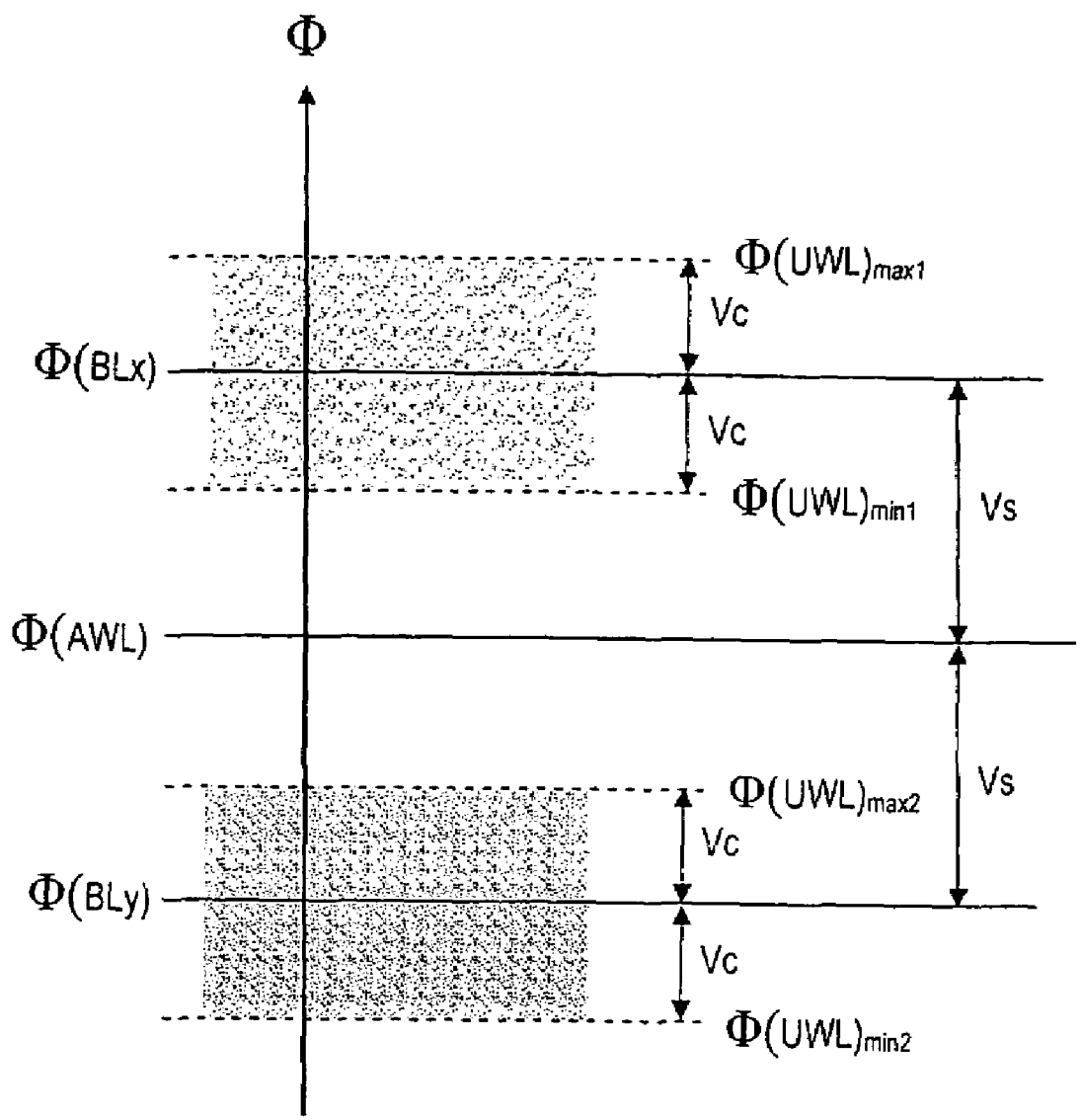

FIG. 3 illustrates the equations (1)–(4) and it shall be noticed that the equations can not be solved; it is impossible to concurrently apply $V_s$ pulses of opposite polarity to addressed cells and at the same time receive non-switching disturbing pulses, V(Dx) and V(Dy), over non-addressed cells. The placement of the UWL potential in FIG. 3 shall always result in that at least one of the Dx and Dy voltages exceeds $V_s$, which by default is more than $|V_c|$, i.e. it is not possible to concurrently apply $+V_s$ and $-V_s$ pulses.

For reasons given above it is typically required to use a two pulse sequence to be able to set addressed cells to desired polarization states. The typical prior art method is to first set all addressed cells to one and the same polarization state, typically by applying a pulse of magnitude Vs and of same polarity to each of the addressed cells. This may be compared to the destructive read situation as mentioned above even though it is here not required to detect charges while applying the switch voltage. When all addressed cells are known to have been set to the same polarization state, e.g. polarization state Y after application of a $-V_s$ pulse, a second step follows where only a selected part of the addressed cells (here called selected addressed cells), viz. those to be set to the opposite polarization state X, shall receive an opposite polarity voltage pulse of magnitude $V_s$, i.e. in our example a $+V_s$ pulse. During application of the $+V_s$ pulse, all other cells, i.e. the unaddressed cells Dx, Dy must be subjected to a voltage not greater than the coercive voltage $V_c$. The non-selected addressed cells Ay, that shall be kept in polarization state Y, must not be subjected to a voltage greater then the coercive voltage $V_c$ in the switch direction of polarization state X. The by the following equations where it is assumed that the addressed cells Ax and Ay previously have been set to polarization state Y by application of a $-V_s$ pulse:

$$V(Ay) = \Phi(BLy) - \Phi(AWL) < +V_c \quad (5)$$

$$V(Ax) = \Phi(BLx) - \Phi(AWL) = +V_s \quad (6)$$

$$V(Dy) = \Phi(BLy) - \Phi(UWL) < |V_c| \quad (7)$$

$$V(Dx) = \Phi(BLx) - (UWL) < |V_c|, \quad (8)$$

where $|V_c| < |V_s|$ and $\Phi \geq 0$.

Which polarization state to be set by $+V_s$ and $-V_s$ is just a matter of definition and it shall be obvious for the reader to adopt to a situation where the equations (5)–(8) instead assumes addressed cells that have been previously set to polarization state X by $+V_s$ and where equation (8) consequently has to result in $-V_s$.

Figure 4:
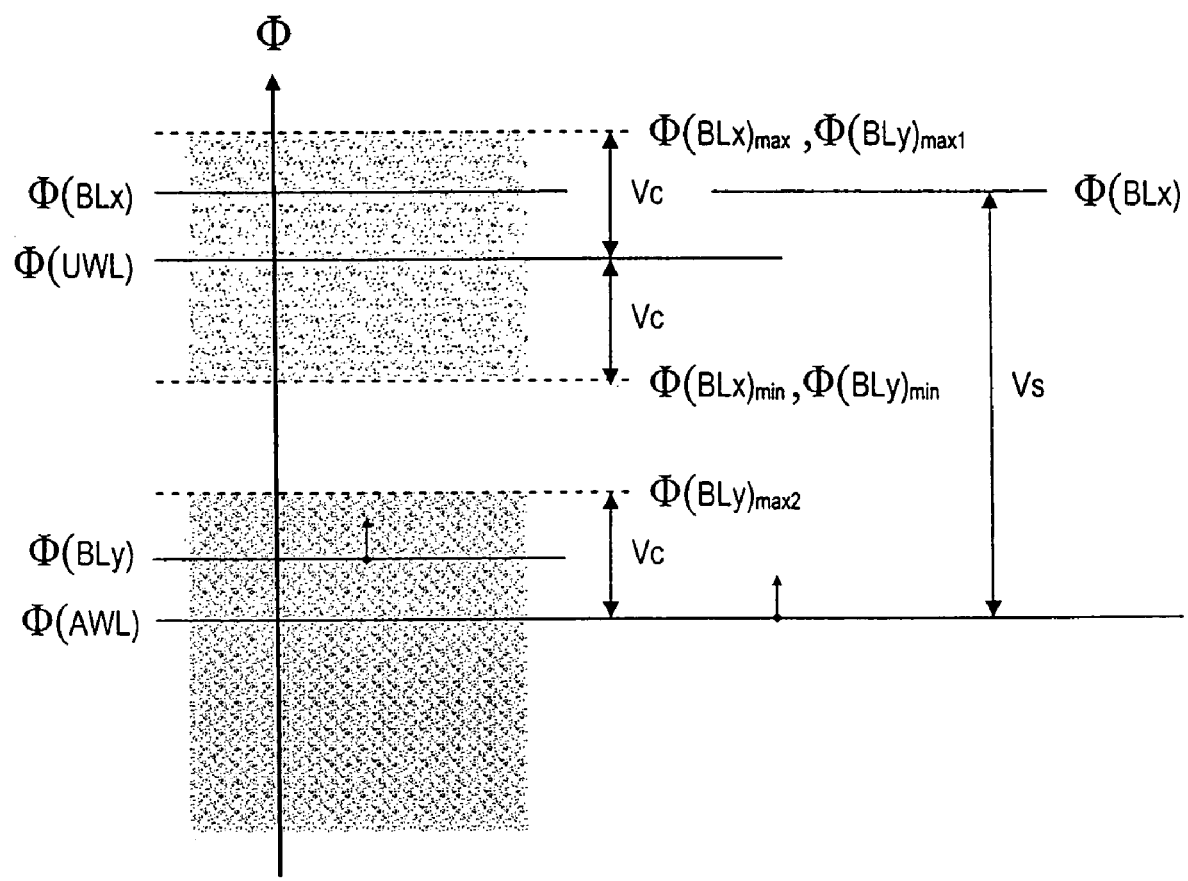

FIG. 4 illustrates the equations (5)–(8). With support from the figure some conclusions will now be accounted for:

The situation described by the equations shall inevitable lead to disturbing voltages on unaddressed cells. For no disturb voltages it is required to set $\Phi(UWL) = \Phi(BLx) = \Phi(BLy)$, which is not possible since that will lead to that all addressed cells, not only the selected ones, will get a $V_s$ switch voltage applied., i.e. the situation would rather correspond to that of a full row read. In FIG. 4 this is shown by that $\Phi(BLy)$ cannot be kept within $+-|V_c|$ from $\Phi(AWL)$, i.e. be kept within the lower dark grey box centered around $\Phi(AWL)$, and at the same time be located at a distance $V_s$ from $\Phi(AWL)$.

To be able to solve the equations it is required that $V_s$ is less than $3*V_c$. The distance between $\Phi(BLx)$ and $\Phi(AWL)$ will always be of size $V_s$. $\Phi(BLy)$ has to be located within $+-|V_c|$ from $\Phi(AWL)$ and within $+-|V_c|$ from $\Phi(UWL)$, i.e. it must be possible to locate $\Phi(BLy)$ within both the lower dark grey box centered around $\Phi(AWL)$ and the upper light grey box centered around $\Phi(UWL)$. By studying FIG. 4, it is found that the first solution will occur when $\Phi(BLx)$ is located at $\Phi(BL_{max})$ and when $\Phi(BLy)$ is located at a coinciding $\Phi(BLy_{max2})$ and $\Phi(BLy_{min})$, i.e. there is not a solution possible until the lower dark grey box around $\Phi(AWL)$ starts to overlap the upper light grey box centered around $\Phi(UWL)$. In that situation $V_s$ equals $3*V_c$. For situations where $V_s < 3*V_c$, it will be possible to produce more of an overlap and consequently there will be more possible solutions.

Figure 5A:
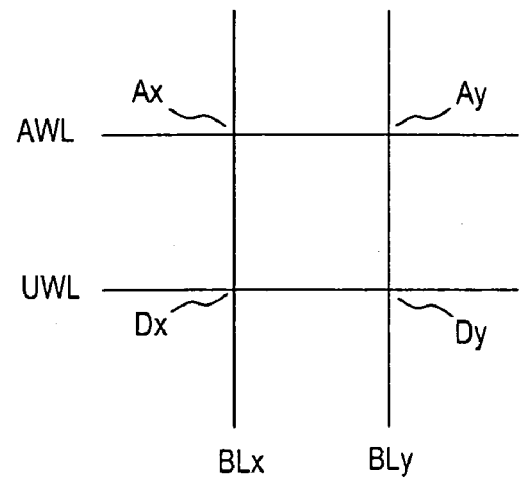

In the Norwegian patent no. 312699 it was shown that the least voltage attainable over the cells Ay, Dx, Dy is $V_s/3$ in a situation corresponding to equations (5)–(8). The common electrodes makes it possible to sum voltages around a closed loop over the cells of interest, i.e. Ax, Ay, Dx, Dy. FIG. 5a illustrates such a closed loop. Conclusion is that the sum of the three non-switching voltages over Ay, Dx and Dy shall result in $|V_s|$, which mathematically implies that the each of the three non-switching cell voltages have to contribute to reach the value $|V_s|$. Minimizing the magnitude of each of those three voltages results in a $V_s/3$ contribution for each cell.

Figure 5B:
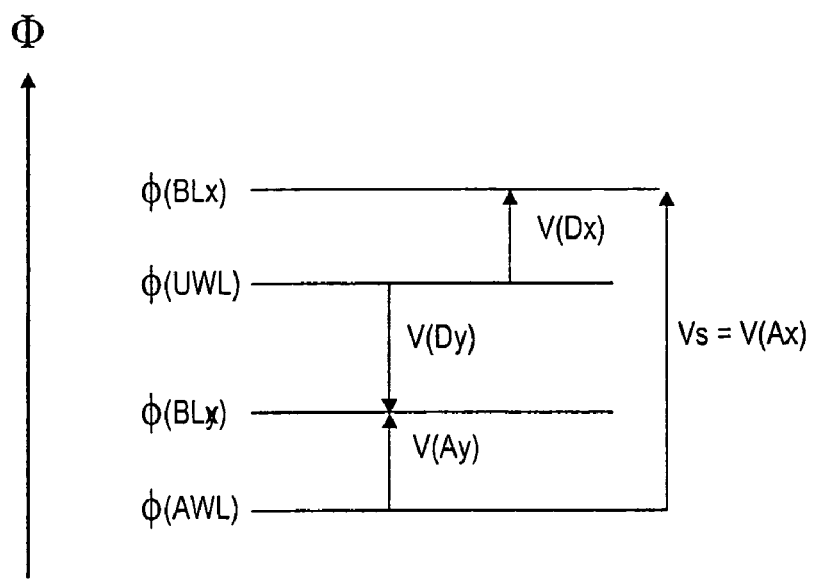

FIG. 5b illustrates the situation and shows cell voltages defined in accordance with the equations (5)–(8) i.e. by the bit line potential minus the word line potential. A cell voltage is having both magnitude and direction given by a positive or negative voltage, i.e. a cell voltage is in this context a two-dimensional vector quantity defined by bit line potential minus word line potential, indicted by the arrows in FIG. 5b. According to equation (6) the voltage over Ax equals $+V_s$, which leads to a situation where the potentials of BLy and UWL can be freely selected, i.e. are free to move along the $\Phi$-axis. By moving the potentials of BLy and UWL it is easy to see that the minimum voltage is $V_s/3$ and that diverging from $V_s/3$ for one of the cell voltages results in that some other cell voltage increases. For example, trying to decrease V(Dx) and V(Dy) by moving $\Phi(UWL)$ and $\Phi(BLy)$ upwards in FIG. 5b and decreasing their relative distance will result in that V(Ay) increases with the sum of the decrease in V(Dx) and V(Dy). From FIG. 5b it can also be concluded that V(Ay) is in the same direction, i.e. of the same polarity, as V(Ax) for all situations where $|V(Dx)|+|V(Dy)|<V_s$. When voltage pulse protocols with a discrete voltage levels are used, it is favourable to use voltage levels based on $V_s/3$ steps since these represents the minimum attainable voltage drop over cells.

From FIG. 5b it can further be concluded that sign(V(Dx))=−sign(V(Dy)), i.e. that the voltage over Dx and Dy cells are of opposite polarity, for all cases where it is desired to keep $|V(Dx)|$, $|V(Dy)|$ and $|V(Ay)|$ below $V_s/2$.

Even though disturbing voltages have shown to be inevitable when it is desired to apply switching voltages to only a selected part of cells along a word line, it is still of interest to keep the disturb voltage pulses as small as possible. For disturb voltage pulses on cells along unaddressed word lines (Dx and Dy cells) it is impossible to say that one or the other will occur more frequently or be worse since that will all depend on what polarizations states that shall be set in the addressed cells, which in turn depend on what data to write, i.e. which logic states to represent in the memory cells. It will typically be just as likely to write a logic '1' as a logic '0' and therefore it is of interest to look into cases where $|V(Dx)|=|V(Dy)|$.

Dx and Dy voltage pulses are problematic since these disturbing voltages occur on a large amount of cells, viz. all unaddressed cells along a bit line. This should be compared to the V(Ay) disturb voltage pulse that may occur on only one cell per bit line, viz. on cells along an addressed word line for which the polarity should not be switched, i.e. for non-selected addressed cells. However, since the addressed cell are of polarization state Y and since V(Ay) as previously shown typically will be in the same direction as the switch pulse for switching to the opposite polarization state, the Ay disturb voltage may contribute in partial switching of the cell in the direction of polarization state X, or even result in an erroneous switch in combination with the imprint phenomena. To reduce the risk of this, it is typically required with some dwell time after the cells have been set to polarization sate Y, allowing the polarization state Y to settle before applying the switch voltages for Ax cells. The dwell time is typically implemented in a pulse protocol by a so called quiescent state where all electrode potentials are kept the same for example between a read/erase cycle and a disturb generating write/rewrite cycle.

The polarity of the disturbing pulses is dependent on whether the polarization state of addressed cells shall be switched or maintained, i.e. the polarity is data dependent. Even though it typically shall be an equal distribution of logic 1 and logic 0 data among the cells over a long period of time, that is not necessarily true for individual cells or group of cells for shorter periods of time. This implies that at any instant after there has been a number of data dependent disturbing voltages, the cells that receive disturbing pulses may be partially switched in different directions and to different degrees. This shall be avoided or at least reduced if the disturbed unaddressed cells Dx and Dy shall always receive a substantial equal amount of voltages of both polarities in connection with any disturb generating operation cycle in the pulse protocol, e.g. if the Dx disturb voltage during the operation cycle is $+V_s/3$, there shall be a post- or pre-disturb cycle that generates a pulse of the same size of opposite polarity, i.e. in this example $-V_s/3$ of substantially the same duration. Since voltage of a certain amplitude to some extent in terms of switching capabilities can be compensated by a lower voltage over a longer period, it is not always required that a certain pulse shape of one amplitude always has to be balanced by a similar pulse of same magnitude but opposite polarity. Instead the area of the pulse may be used to measure the switching effect—a voltage pulse of a certain polarity and pulse area (unit Volt seconds), maybe balanced by a pulse of opposite polarity with substantially the same pulse area.

To avoid switching of cells in the matrix during application of the voltages in the pre- or post-disturb cycle, the general rule is that there shall never be a voltage subjected to a cell that causes the cell to switch to the opposite direction of where it resides. The situation in general may be described by the following equations in terms of voltages:

$$V(Ay)=\Phi(BLy)-\Phi(AWL)<+V_c \quad (9)$$

$$V(Ax)=\Phi(BLx)-\Phi(AWL)>-V_c \quad (10)$$

$$V(Dy)=\Phi(BLy)-\Phi(UWL)<|V_c| \quad (11)$$

$$V(Dx)=\Phi(BLx)-\Phi(UWL)<|V_c| \quad (12)$$

Comparing equations (9)–(12) with equations (5)–(8) shows the difference that $V(Ax)$ now shall be kept above $-V_c$ instead of being equal to $V_s$. This indicates that it typically should be easier to find solutions for the system of equations (9)–(12) than for (5)–(8) since the restrictions are lower.

Figure 6:
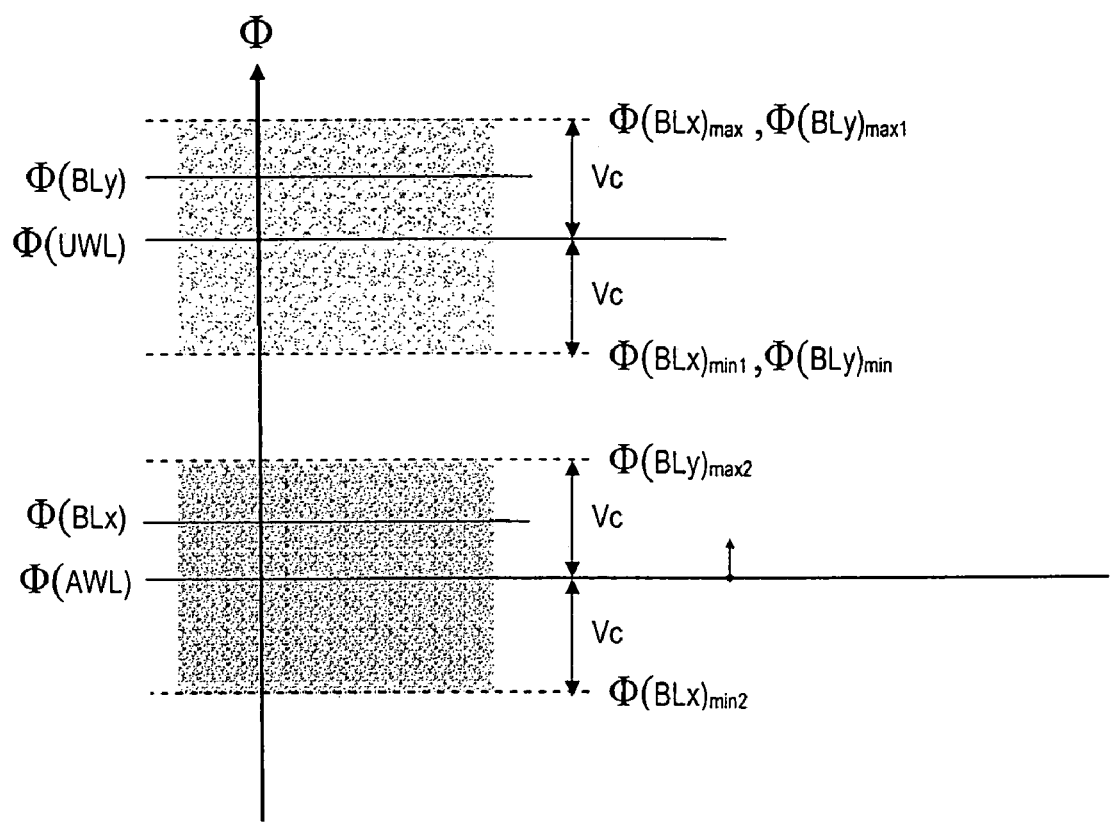

FIG. 6 is illustrating equations (9)–(12) in a corresponding manner as FIG. 4 is illustrating equations (5)–(8), and correspondingly FIG. 6 will be used as reference when the solutions are investigated. Since $\Phi(BLx)$ and $\Phi(BLy)$ both have to be located within $+-|V_c|$ from $\Phi(UWL)$, since $\Phi(BLy)$ has to be kept at maximum $|V_c|$ above $\Phi(AWL)$ and since $\Phi(BLx)$ has to be kept at minimum $|V_c|$ below $\Phi(AWL)$, there will be no solution possible for distances between $\Phi(UWL)$ and $\Phi(AWL)$ exceeding $2|V_c|$. This is shown in FIG. 6 by that the lower dark-grey box centered around $\Phi(AWL)$ has to start overlapping the upper light grey box centered around $\Phi(UWL)$ before any solutions exist.

Previously it was shown that the situation $V(Dy)=-V(Dx)=V(D)$ is of interest during the disturb generating operation cycle and consequently the same is of interest for the pre- or post disturb cycle since these typically relate to or even mimic the disturbing pulses using opposite-polarity. It is further of interest to distinguish between two situations, viz. where $\Phi(UWL)=\Phi(AWL)$ and where $\Phi(UWL)< >\Phi(AWL)$. In the latter case it will be possible to handle voltages applied to cells along an addressed word line separately from the voltages applied to unaddressed cells, while in the former case all word lines will be treated equally during application of the post- or pre-disturbing pulses.

Figure 7:
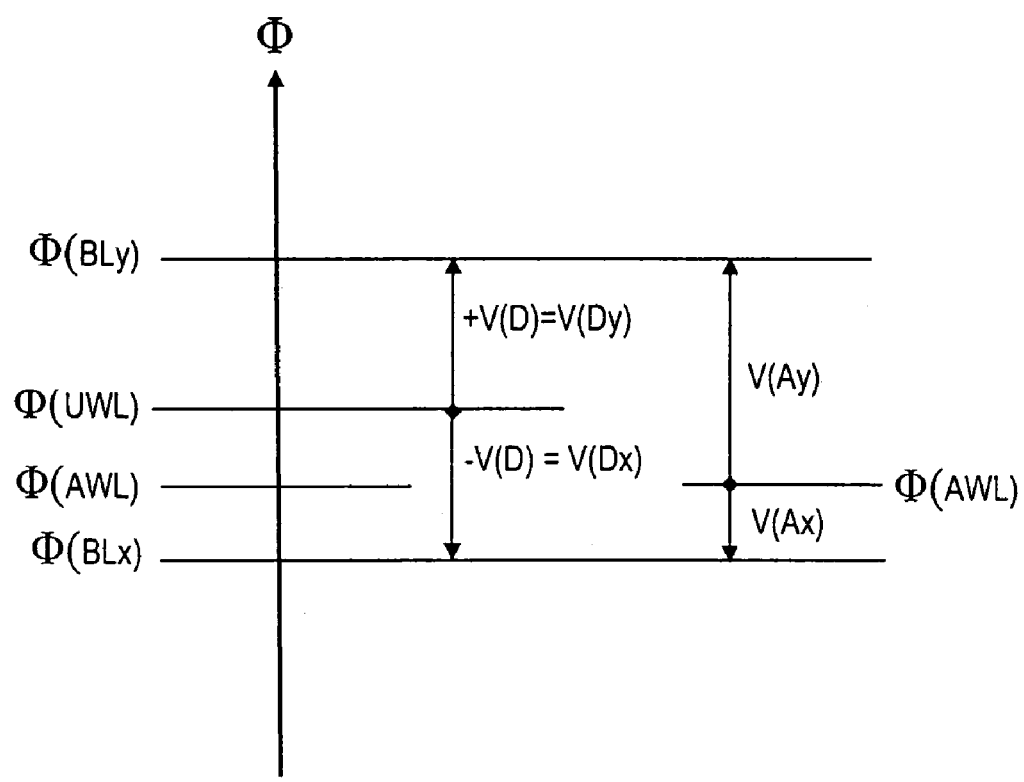

FIG. 7 is a modified version of FIG. 6 and shows the situation $V(Dy)=-V(Dx)=V(D)$, with $\Phi(UWL)< >\Phi(AWL)$. A cell voltage is defined as bit line voltage minus word line voltage. It shall be understood from FIG. 7 that $|V(D)|<|V_c|$ and that it is just a matter of exchanging positions for $\Phi(BLy)$ and $\Phi(BLx)$ to accomplish opposite polarities for cell voltages along BLx and BLy. In cases where it is desired to keep cell voltages $V(Ax)$ and $V(Ay)$ below $2V(D)$, the potential of the addressed word line (AWL) will have to be kept between the potentials of the bit lines BLx and BLy. Consequently the polarity of cell voltages along a particular bit line typically will be the same but the polarities will be opposite between cells located along bit lines BLx and BLy. Alternatively, if it is allowed with voltages on cells along the addressed word line larger than $2V(D)$, the addressed word line cell voltages $V(Ax)$ and $V(Ay)$ may be of same polarity.

Assume the disturb generating operation cycle results in $+V(D)$ for Dx cells and $-V(D)$ for Dy cells. (The opposite polarity is of course also possible and will in the following only require minor changes that shall be apparent for the reader.) According to the previous discussion it is desired to use pre- and/or post-disturbing pulses which shall be of same size but opposite polarity to the disturbing pulses, i.e. in this case that $V(Dx)=-V(D)$ and $V(Dy)=V(D)$. According to what was explained with reference to FIG. 7, this will result in that $V(Ax)$ will be in the direction for switching to polarization state Y and that $V(Ay)$ will be in the direction for switching to polarization state X. This is not desirable, especially in case of a post-disturb pulse, since it entails a freshly switched cell to receive a voltage pulse in the opposite direction to the switch voltage. A post disturb pulse $V(Ax)$ in the switch direction of polarization state Y should be worse since the switch to polarization state X is closest in time. However, it may also be problems with a post disturb pulse $V(Ay)$ in the switch direction of polarization state Y, especially since it is likely that the addressed cells recently, close before application of the disturb generating operation cycle, has been switched to polarization state Y. Thus, in the situation described it is apparently not possible to fully avoid the risk of accidental switch in the wrong direction for post disturbing pulses even though it shall be possible to decrease the cell voltage in the undesired direction for one type of addressed cells, e.g. Ax cells, to the expense of increased voltage in the undesired direction over Ay cells. However, by instead using a pre-disturb pulse the fact that all addressed cells shall be of polarization state Y can be utilized, meaning that the addressed cells shall be insensible for voltages in the polarization state Y direction. This actually means that equation (10) in the case of a pre-disturb pulse may be deleted since there will be no restrictions on Ax cells. Deletion of equation (10) will be illustrated in FIG. 6 by deleting the lower potential limit $\Phi(BLx_{min2})$ of the lower dark grey box centered around $\Phi(AWL)$. Thus it shall be preferred to chose electrode potentials to balance the disturbing voltages such that cell voltages along unaddressed word line cells (Dx and Dy) are formed as pre-disturbing pulses and where voltages over addressed cells (Ax and Ay) are kept only in the switching direction of polarization state Y, i.e. in the direction of the polarization state where the addressed cells already are known to have been switched to. This is typically accomplished by setting the addressed word line (AWL) potential to be equal to the bit line BLy potential. For instance in FIG. 7 by selecting $\Phi(AWL)=\Phi(BLy)$, which results in that $V(Ax)=-2V(D)$ and $V(Ay)=0$, i.e. voltage pulses on addressed cells are only in the switching direction of polarization state Y.

Another benefit of using a pre-disturb pulse instead of a post-disturb pulse is that the previously mentioned dwell time between switching pulses may be efficiently used for something besides waiting for the addressed cells to settle in polarization state Y.

Figure 8:
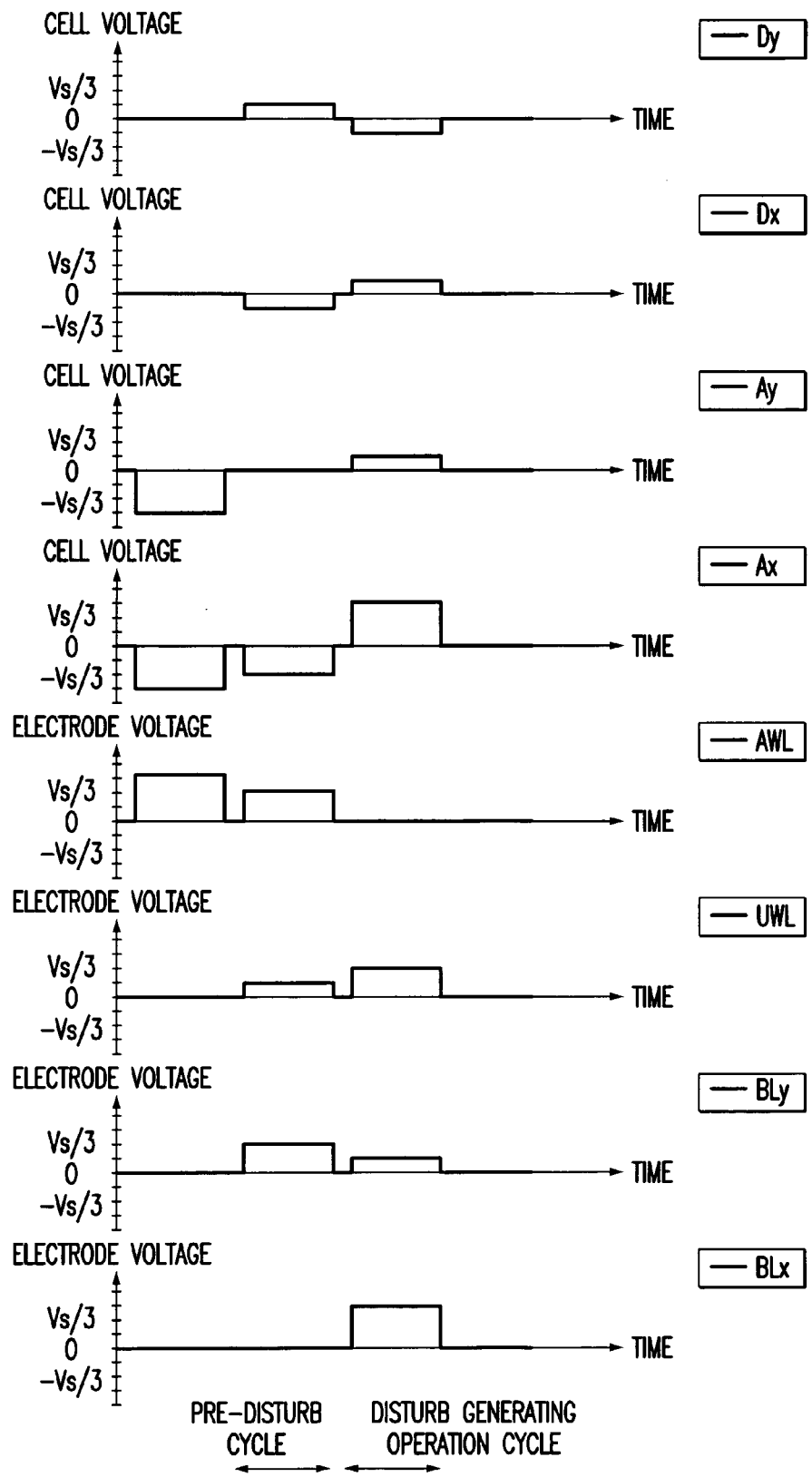

FIG. 8 illustrates a preferred embodiment according to the above by using a $V_s/3$ based pulse protocol with a pre-disturb cycle, showing both electrode potentials ($\Phi(AWL)$, $\Phi(UWL)$, $\Phi(BLx)$ and $\Phi(BLy)$) and resulting cell voltages ($V(Dx)$, $V(Dy)$, $V(Ax)$, $V(Ay)$). One should especially note the pre-disturb pulse on unaddressed word lines (Dx and Dy), which is of same size but of opposite polarity compared to the $V_s/3$ disturb pulse that follows directly after. Also note that there is only pre-disturbing voltages present on addressed cells in the already polarized direction; a $-2V_s/3$ pulse for Ax cells and no voltage over Ay cells.

In FIG. 8 and in coming illustrations of pulse protocols, voltage transitions are shown very steep and voltage levels seem to change perfectly synchronized with no attention paid to the sequence of when certain electric potentials are changed. In a real situation voltage pulses will of course require certain time before reaching the targeted level and simultaneous change of voltage levels at different locations, e.g. at a word line and a bit line, is not always possible. However, in the scope of what is claimed for the present invention these details are not important and have been left out for reasons of convenient presentation. The time scale used in figures is neither necessarily in accordance with the real relative proportions. This is also for reasons of convenient presentation. A pulse that has smaller duration than another is typically shown smaller accordingly, but to what degree a pulse is smaller/bigger than another should not be based on what is shown in figures, instead information on the size of the pulses may be found in the accompanying descriptive text.

The embodiment in FIG. 8 primarily addresses risk of unbalanced number of disturbing voltages in certain directions, the risk of partial switching and the risk of accidental switching in wrong direction due to imprint, but it does not focus on the problems with sneak/relaxation currents. Sneak/relaxation currents will have to be of a sufficiently low degree to allow reading in any possible read operation that may follow in or close after the disturb generating operation cycle. It is possible to wait for sneak/relaxation currents to diminish, but since this will slow down the attainable operational data rate, it is of interest to speed up the decrease. The main part of sneak/relaxation currents typically origin from application of voltages on unaddressed cells. The polarity of disturbing voltages will, as previously shown, depend on the voltage applied to the addressed cell(s) along the same bit line as the unaddressed cells. Consequently the direction of sneak/relaxation currents will be influenced by the polarity of voltages applied to addressed cells which in turn typically are dependent on what data to write/read. Since voltages of opposite polarities typically should give rise to sneak/relaxation currents of opposite directions, balancing a positive voltage with a negative, for example as in the embodiment shown by FIG. 8, therefore also should decrease the amount of sneak/relaxation currents present after application of the disturb generating operation cycle. However, in practice it will typically be the last applied voltage pulse that contributes the most to sneak/relaxation currents. Of this reason it is possible to accomplish a faster decrease of sneak/relaxation currents compared to waiting only by applying a post-disturb pulse that results in a voltage pulse of opposite polarity but less duration compared to a preceding voltage pulse on unaddressed cells. In general it is not necessary with same amplitude and less duration, the same effect may as well be achieved by using a post-disturb pulse with opposite polarity and of significantly less pulse area than the preceding voltage pulse. It is for example possible with pulses of less duration and less magnitude. When using a discrete step voltage protocol as the three-level $V_s/3$ pulse protocol in the embodiment of FIG. 8, the amplitude of the post-disturbing pulses for unaddressed cells shall be of opposite polarity to, but of the same magnitude as a preceding disturbing pulse on the same cells.

The problem to solve during application of a post-disturb pulse may again be described by the equations (9)–(12) and consequently there will again be a risk of accidental switching in the wrong direction, especially for the addressed cells which may be prone to flip-back due to imprint. However, this time the pulse is smaller, typically in the regime of 5–20 times smaller compared to the applied voltage pulse in the disturb generating operation cycle. This shall in many applications reduce the risk of accidental switch in the wrong direction to an acceptable level. However, if it is considered to be a small, but still possible risk of accidental switching, one solution may be to reduce the post disturb voltage on addressed cells in the direction closest in time to the latest switch, i.e. typically by reducing the voltage in the y-direction for Ax cells to the price of a corresponding slightly higher magnitude in the x-direction for Ay cells. If the less duration and possible less magnitude of the post-disturbing pulses compared to the disturbing pulses cause no problems with partial and/or accidental switching due to imprint, there is not much to gain from treating $\Phi(AWL)$ separate from $\Phi(UWL)$ for the post-disturb pulses. Setting $\Phi(AWL)=\Phi(UWL)$ will instead lead to simpler and less complex electrode voltage control and results in that the situation may be described by only equation (11)–(12) with a greater degree of freedom in the solutions.

Figure 9:
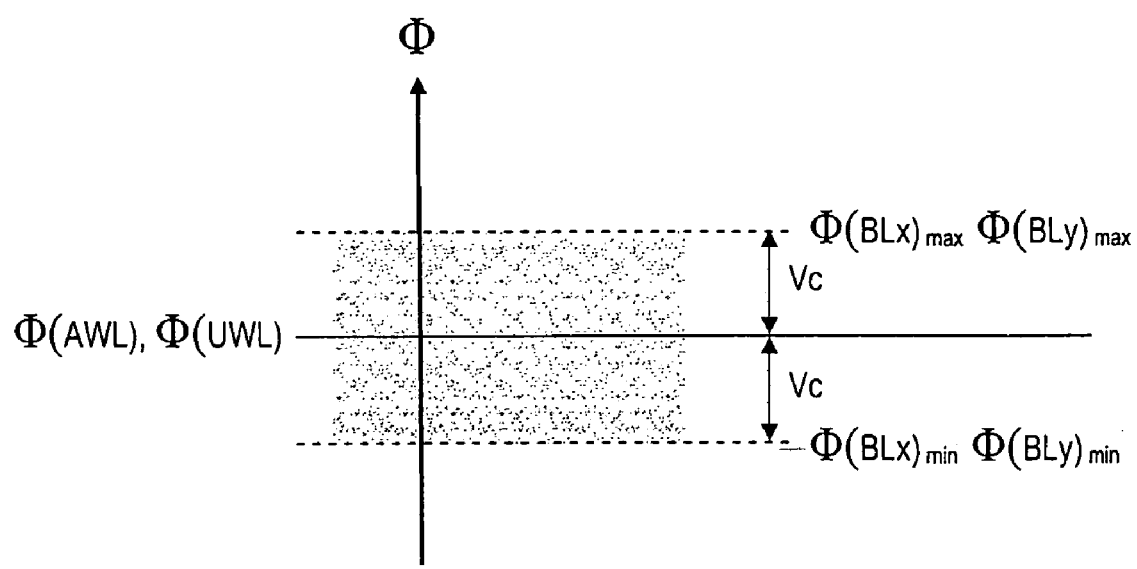

FIG. 9 illustrates equations (11)–(12) when $\Phi(AWL)=\Phi(UWL)$. In practice it is possible to create any type of voltages on the cells but the potential of any of the bit lines (BL and BLx) must-differ no more than $|V_c|$ from the word line potential.

Figure 10:
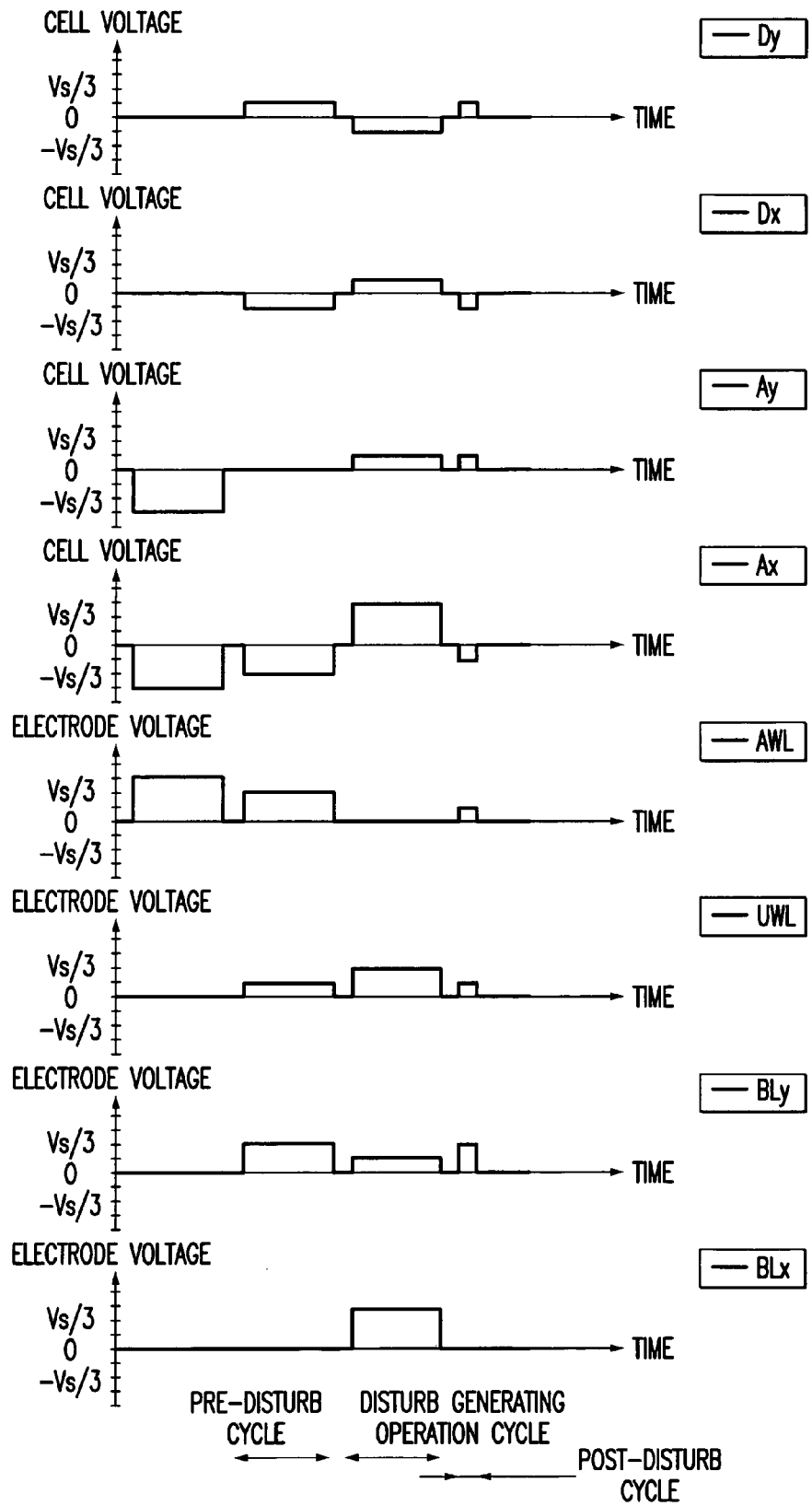

FIG. 10 illustrates a preferred embodiment according to the above by using a $V_s/3$ based pulse protocol with a pre-disturb cycle as previously shown in FIG. 8 and with a post-disturb pulse of less duration than the disturb pulse. The figure shows both electrode potentials ($\Phi(AWL)$, $\Phi(UWL)$, $\Phi(BLx)$ and $\Phi(BLy)$) and resulting cell voltages (V(Dx), V(Dy), V(Ax), V(Ay)). Note that the post disturb pulse looks the same for all cells along a bit line even though it, as previously explained, would be possible to have voltages on addressed cells that differs from the unaddressed cell voltages, i.e. to have a situation that is similar as for the pre-disturb pulse. In the light of what has been explained, even though not explicitly shown in FIG. 10, it shall be realized that the post-disturbing pulses may be asymmetric, i.e. that the disturb pulse for example could be produced to have greater relative magnitude in either the positive or negative direction. It may be observed that by adding the post-disturbing pulses in FIG. 10, there is no longer a balance of positive and negative pulses applied to unaddressed cells, which was one of the major ideas behind the previously presented pre-disturb pulse. However, since the post disturb pulse typically has a short duration, the effect is less and may be acceptable in some situations. It is though easy to compensate for the unbalanced situation by decreasing the duration of the pre-disturb pulse since the polarity of the post- and pre-disturb pulses in FIG. 10 are the same. Consequently it is just to decrease the duration of the pre-disturb pulse with the duration of the post-disturb pulse to re-achieve a balanced amount of positive and negative voltage pulses on unaddressed cells.

The situation in FIG. 10 where $\Phi(AWL)=\Phi(UWL)$ may in some cases not be permitted, for example in cases where even a pulse of small duration in the opposite direction close after a switch pulse on addressed cells is not acceptable. If it in the post-disturb cycle is desired not to allow any voltage in a certain direction for addressed cells, typically in the y-direction for Ax cells, and that it at the same time is desired not to allow a higher voltage for the other type of cells, e.g. in the x-direction for Ay cells, it is according to FIG. 7 not possible to find a solution. At least it is not possible as long as voltage pulses concurrently shall be applied on Dx and Dy cells with mutual opposite polarities and opposite polarities to the disturbing voltage subjected to the same cells during the disturb generating operation cycle. However, by separating the voltage pulses on unaddressed cells (Dx and Dy) in time, such that for example a post-disturb pulse first is applied to Dx cells and then to Dy cells, it is possible to avoid unwanted post-disturb voltages in a certain direction on addressed cells (Ax and Ay cells) and achieve ordinary disturb voltage magnitudes in the other direction only. In terms of the previously used equation this may be accomplished by letting equations (11) or (12) evaluate to zero, i.e. setting either of the bit line potentials to equal the unaddressed bit line potential, while the other of the equations evaluates to the desired voltage on the corresponding unaddressed cell. At the same time the addressed word line potential shall be set to the same potential as the bit line of the addressed cells that shall not receive any voltage opposite to their switch direction. Thus, by producing post-disturb pulses of one polarity at time, it is possible to achieve two ordinary magnitude, single polarity post-disturb pulses opposite to the switch direction for addressed cells of one polarization state only, e.g. Ay cells, while the other polarization state cells, e.g. Ax cells, at the same time receive substantially zero post-disturb voltage. Since the Ax cells have been switched most recently it is typically those cells that shall be selected to receive no post-disturb voltage.

Figure 11:
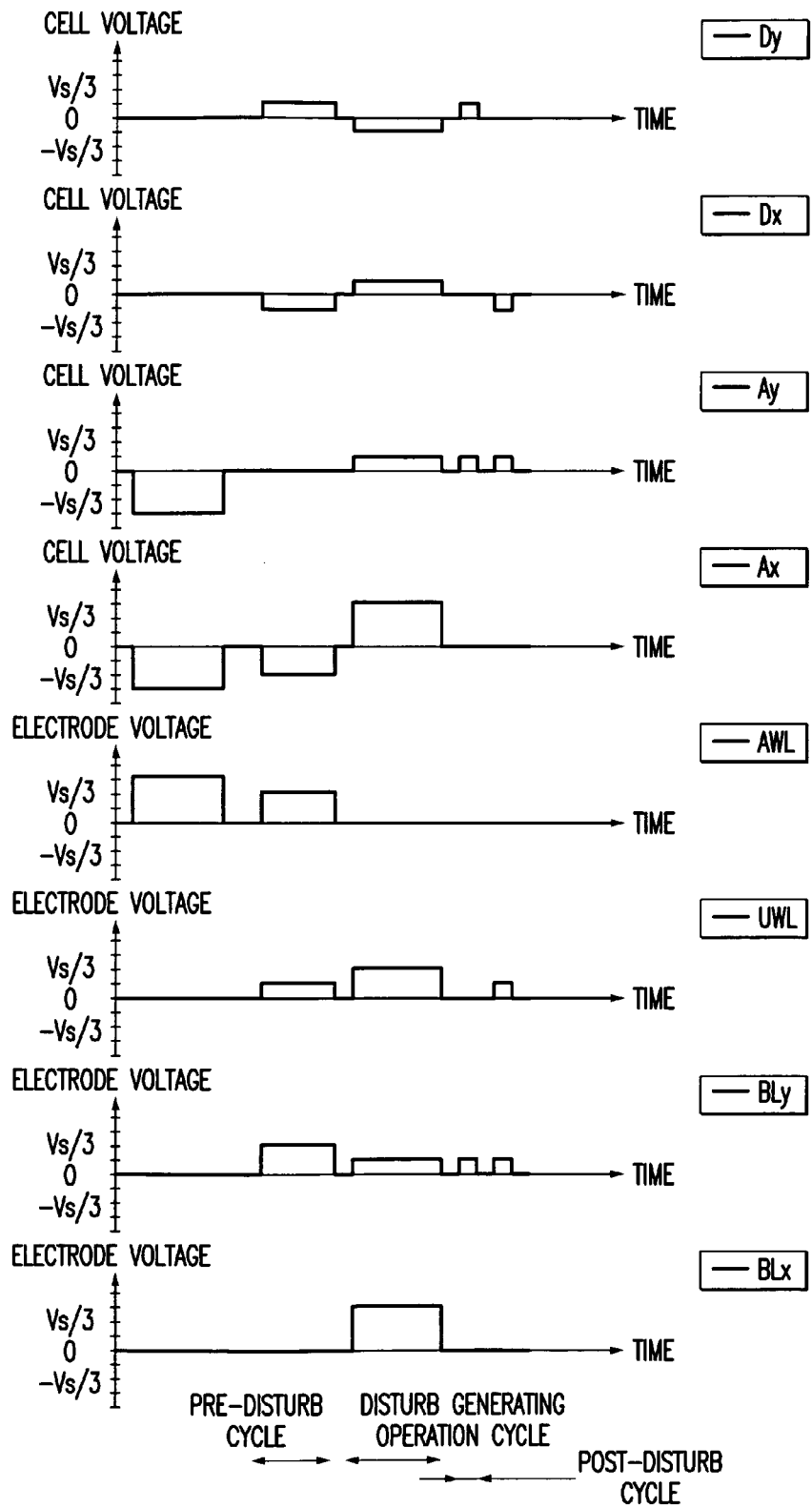

FIG. 11 provides an illustration of an embodiment where the post-disturb pulses on Dx and Dy cells have been separated in time for avoiding post-disturb pulses on Ax cells in the direction of polarization state Y. The embodiment is further using a $V_s/3$ based pulse protocol with a pre-disturb cycle as previously shown in FIG. 8. Note that there are no post-disturb voltages at all on Ax cells, but that Ay cells will get two post-disturb pulses in the x-direction of the same magnitude and duration as the pos-disturb pulses on Dx and Dy cells. In a typical situation this will not be critical since a relatively long time has elapsed since Ay cells was switched to polarization state Y, at least compared to the switch of Ax cells. In line with information previously presented in connection to the embodiment of FIG. 10, the pre-disturb pulse duration have been decreased to accomplish a balanced amount of voltage pulses on unaddressed cells in both switch directions.

A post disturb pulse for faster decrease of sneak/relaxation currents may not only be a single voltage pulse, it is also possible with sequences of post disturb voltage pulses, for example a pulse train of varying voltage levels, durations, polarities, shapes etc. In the light of what have been accentuated above and shown with reference to FIG. 7 and FIG. 9 it shall be realized that in principle any type of non-switching post- and pre-disturb voltage pulses may be created. Of particular interest are pulses with a decreasing amplitude and/or duration. Other pulse shapes of interest are for example saw tooth shaped pulses, e.g. where every pulse starts with a certain magnitude which for a predetermined period of time decreases towards zero.

Figure 12:
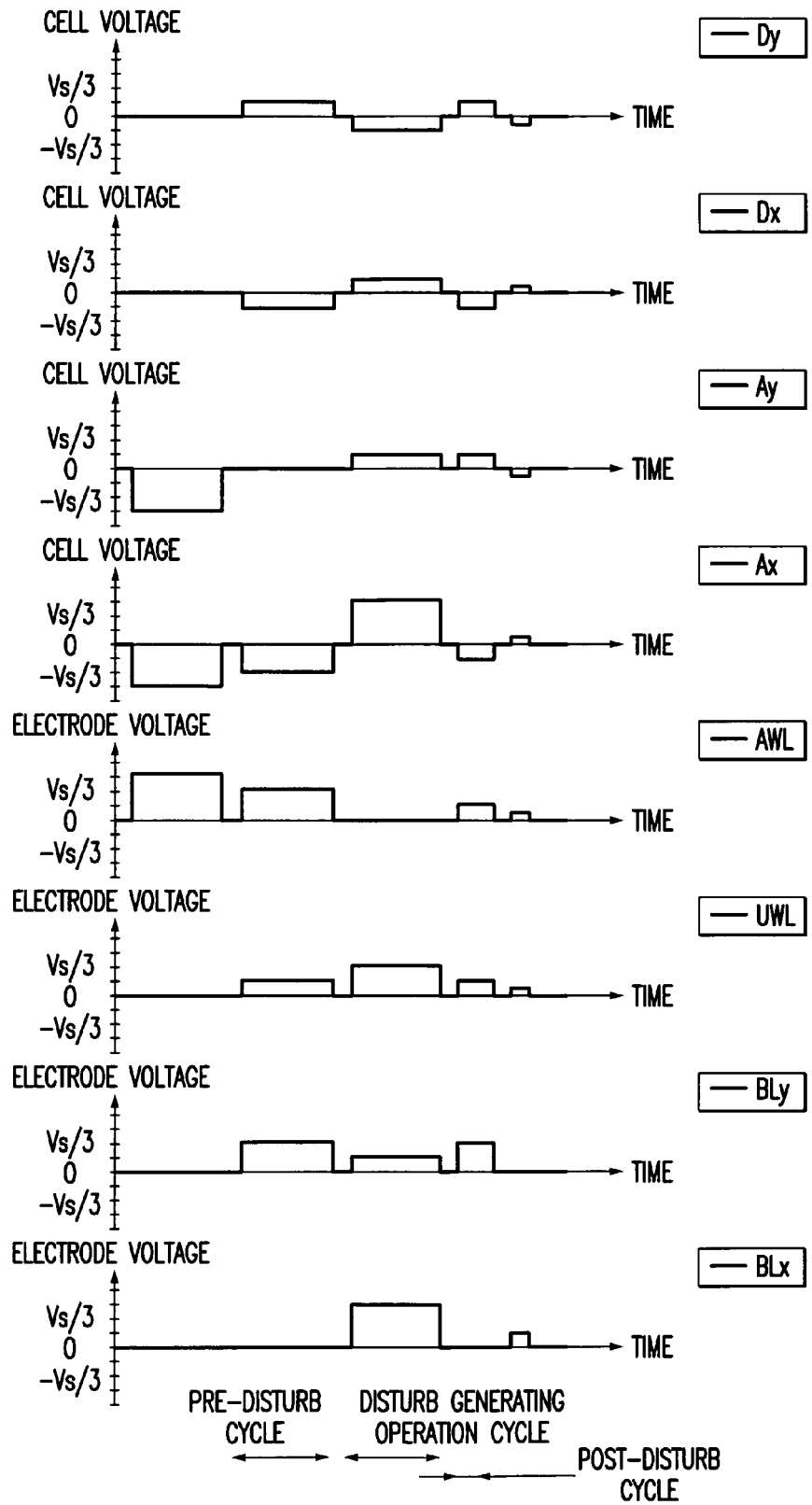

FIG. 12 illustrates a preferred embodiment according to the above using a $V_s/6$ based pulse protocol with yet another post-disturb pulse compared to FIG. 10, where each pulse is of less duration, less magnitude and opposite polarity compared to the preceding pulse for faster decrease of lingering sneak/relaxation currents. The figure shows both electrode potentials ($\Phi$(AWL), $\Phi$(UWL), $\Phi$(BLx) and $\Phi$(BLy)) and resulting cell voltages (V(Dx), V(Dy), V(Ax), V(Ay)). Note that it is only the last of the post disturb pulses that provides the smaller voltage magnitude $V_s/6$ over cells. Since the two post disturbing pulses in this case will balance out each other to some extent, there is typically less need to compensate with change in duration of the pre-disturb pulse, at least there should be a smaller adjustment needed than for example in FIG. 11. Another embodiment is provided by using a strict $V_s/3$ protocol, i.e. using a magnitude of $V_s/3$ for all post-disturb pulses and instead decrease the duration of the pulses such that every post-disturb pulse is produced with a shorter duration than the preceding pulse.

The durations of the pre- and/or post disturb pulses may be predetermined, for example configured in the device before the memory is used in operation, but might as well be controlled during operation based on environmental metrics, for example by using a decision algorithm with environmental metrics as input variables. It has for example been found that at elevated temperatures the pulse durations have to increase to provide the same effect as at room temperature. For example, in experiments it has been found that pulse durations at 60° C. may have to be larger than at room temperature to provide the same effect. Typically the longer durations are in the interval 1–2 times the duration at room temperature. Efficient run-time adjustable pulse durations may be accomplished by using a temperature sensor or similar that provides metrics on the proximity temperature for the relevant passive-matrix.

It is often hard to find the exact origin of all sneak/relaxation currents and the currents are affected by the design, architecture, choice of material etc of the device that comprises the passive matrix. Often the passive matrix is formed in a stacked fashion with several layers of memory material and electrodes and neighbouring passive matrices, often referred to as sub-matrices. A sub-matrix, sometimes also called segment, is here defined as a passive matrix that has substantial electrical isolation from the passive matrix that contains the currently addressed cells, i.e. it is a passive matrix within the same device and that in an ideal situation shall receive substantially no disturbing voltages when another sub-matrix within the device is exposed to a disturb generating operation cycle. However, due to imperfections in most practical devices it has been found that sneak/relaxation currents may not only originate from unaddressed cells within the passive matrix currently addressed, there may also be non-negligible contributions of sneak/relaxation currents originating from interlayer coupling, for example between an unaddressed word line in an adjacent passive matrix and a bit line in the addressed passive matrix, and from between bit lines in the currently addressed segment.

The bit line to bit line sneak/relaxation currents are strongly data dependent and are mainly a result from a voltage difference between a bit line and adjacent bit lines, i.e. typically two adjacent bit lines per bit line; one on each side. Different values on addressed cells along adjacent bit lines result in a voltage difference and hence sneak currents. The voltage difference is typically $2V_s/3$ in a disturb generating operation cycle that are using a $V_s/3$ based selection rule as shown in previous examples. The bit line to bit line sneak/relaxation currents further will depend on the distance between bit lines, the area of the bit line facing an adjacent bit line and on the material between bit lines. These are factors typically are defined and set by a lot of other requirements, e.g. requirements on integration density, chip area, electrode thickness etc. and consequently it is often difficult to achieve a passive matrix design that fully eliminates influence of bit line to bit line sneak and relaxation currents. The possible risk of significant bit line to bit line sneak/relaxation current shall therefore be taken into account when pre- and post-disturb pulses are designed.

Interlayer coupled sneak/relaxation currents are mainly pertaining to non-perfect isolation between separated passive-matrixes, referred to as sub-matrices, on the same chip. Various methods and reason for segmenting, or dividing a passive matrix-based memory into sub-matrices exists in prior art. Often a passive matrix device will consist of at least one or two adjacent passive matrices in parallel layers above and/or below, separated by an isolating layer, for example a dielectric layer. However, a non-perfect isolating layer will allow sneak currents from an adjacent inactive passive matrix electrode to reach an addressed bit line electrode in the currently active passive matrix, for example as a result of a potential difference between the electrodes in the different matrices. Typically the main contribution of sneak currents from adjacent passive matrices origins from passive matrices closest layered above and below the currently addressed passive matrix, i.e. from passive matrices that are in adjacent parallel planes to the currently addressed passive matrix. In an inactive passive matrix typically all electrodes are held at a common potential in a so called quiescent state. By proper selection of the quiescent potential level in adjacent inactive matrices it is possible to achieve controlled interlayer potential differences which in turn lead to sneak/relaxation currents that can be reduced and/or controlled by pre- and post-disturb pulses in the currently active passive matrix. Similar to the "ordinary" sneak/relaxation currents between bit lines and unaddressed word lines, interlayer sneak/relaxation currents will decrease faster if the voltage pulse/difference that generates the currents during the disturb generating voltage cycle is followed by an opposite polarity voltage pulse/difference of smaller area. This will be achieved if the electrode potential level, i.e. the quiescent voltage level, of the electrodes in the adjacent inactive passive matrix is set to the same potential level as the unaddressed word line in the currently addressed (active) passive matrix.

There are various methods in prior art to compensate for sneak/relaxation current contribution in a readout value. Some existing methods benefit from a consistent behaviour of sneak/relaxation currents in consecutive readouts and from that different individual bit lines that are representing the same data value shall behave the same and possess substantially the same characteristics. Reference bit lines are typically used to represent a predetermined data value. However, since the polarity of disturbing pulses are data dependent and since sneak currents are complex and exists within bit lines, between bit lines and even between layers, the fluctuation of sneak/relaxation currents will be data dependent as well. A more consistent and more data independent behaviour may be achieved by introducing a post-disturb pulse, or a pulse train of post disturb pulses, that ends in a single polarity post-disturb pulse for all bit lines (BLx and BLy), independent on the data value. In previous embodiments the polarities of pre- and/or post-disturb pulses on unaddressed cells always have been of opposite polarities on bit lines BLx and BLy as a result of that the disturbing voltages typically are of opposite polarities on bit lines BLx and BLy. In the light of what was presented in connection with FIG. 9 it can be realized that it is just to set the bit line electrodes to the same potential to create pulses with single polarity. At the same time this opens up for the possibility of zero voltage over addressed cells since the addressed word line potential in this situation can be set to the same as both bit line potentials. Use of a single polarity end pulse will typically make the total post-disturb pulse areas for unaddressed cells along BLx and BLy bit lines different, which in turn makes it desirable to be able to have different durations for the pre-disturb pulse for Dx and Dy cells. To accomplish this for the pre-disturb pulse, the addressed word line potential has to be selected such that Ay cells receive zero voltage, or voltage only in the direction of polarization state Y, while the unaddressed word line potential are set equal to one type of bit line potentials, e.g. BLy potentials, and while the potential of the other type of bit lines, e.g. BLx, are selected to produce the desirable pre-disturb voltage on the corresponding unaddressed cells.

Figure 13:
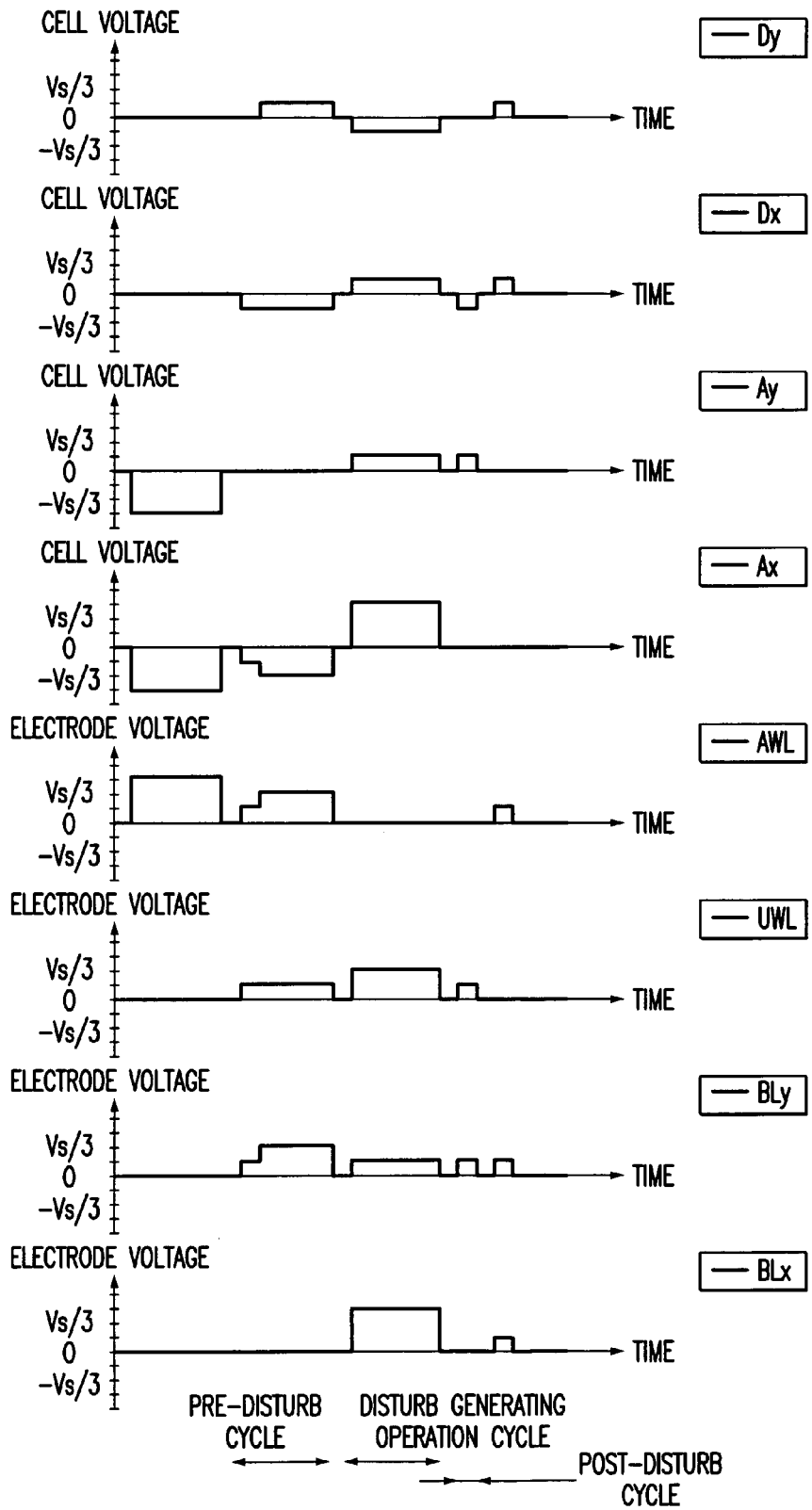

FIG. 13 shows a preferred embodiment using a $V_s/3$ based pulse protocol with two post disturb pulses and where the last of the post disturb pulses has the same polarity for all bit lines for better control and consistent behavior of lingering sneak/relaxation currents. The figure shows both electrode potentials ($\Phi(AWL)$, $\Phi(UWL)$, $\Phi(BLx)$ and $\Phi(BLy)$) and resulting cell voltages (V(Dx), V(Dy), V(Ax), V(Ay)). Note that similar to the embodiment of FIG. 11 there are no voltages opposite to the switch direction for Ax cells in the post-disturb cycle. Also note that due to the single polarity end pulse the total pulse area in the post-disturb cycle are not the same for unaddressed cells along BLx and BLy bit lines, but that this has been compensated for by decreasing the pre-disturb pulse duration only for Dy cells, such that there nevertheless will be a balanced amount of positive and negative pulses on unaddressed cells.

Post-disturb pulses that end in a single polarity as illustrated in FIG. 13 may not always provide an overall good result. Post-disturb end-pulses of same polarity on all bit lines will always cause some cells to receive two adjacent pulses with same polarity which typically is not the best situation for fast decrease of sneak/relaxation currents. Using single polarity end pulses may in other words provide a data independent effect but the effect of faster decrease of sneak/relaxation currents may be less compared to a situation where the polarity of the post-disturb end pulses are data dependent and may differ between bit lines.

Advantages of the method according to the invention include enabling more reliable readouts which for example will allow for an increase in data rate. Further, memory cells will be less prone to partial switching and accidental switching due to imprint during operation.

Those skilled in the art shall understand that variants, changes in details such as voltage levels, durations, pulse protocols etc. and arrangements of parts and methods that have been described and illustrated in order to explain the nature of the invention may be made without departing from the scope and principles of the invention.

What is claimed is:

1. A method for operating a ferroelectric or electret memory device employing passive matrix addressing, wherein said memory device comprises cells in the form of a ferroelectric or electret thin-film polarizable material exhibiting hysteresis, particularly a ferroelectric or electret polymer thin film, and a first and second set of respective parallel electrodes, wherein the electrodes of the first set, termed word lines (WL), are provided in substantially orthogonal relationship to the electrodes of the second set, termed bit lines (BL), wherein the electrodes of said first and second set are provided in direct or indirect contact with the thin-film material of the memory cells, wherein a cell in the device can be set to a polarization state X or Y or switched between these by applying a switching voltage ($V_s$) larger than a coercive voltage ($V_c$) corresponding to a coercive field ($E_c$) of the polarizable material between a word line (WL) and a bit line (BL) addressing the cell, wherein the method comprises a voltage pulse protocol with at least one disturb generating operation cycle for switching selected addressed cells (Ax) to polarization state X, the disturb generating operation cycle involving selected addressed cells located in or at the crossing of addressed word lines (AWL) and selected bit lines (BLx), non-selected addressed cells (Ay) located in the intersection of the addressed word lines and non-selected bit lines (BLy), unaddressed cells (Dx) located in the intersection of unaddressed word lines (UWL) and the selected bit lines, and unaddressed cells (Dy) located in the intersection of the unaddressed word lines and the non-selected bit lines, wherein during the disturb generating operation cycle the potential difference between the addressed word lines and the selected bit lines is equal to the switching voltage, and the potential difference between the addressed word lines and the non-selected bit lines is less than the magnitude of the coercive voltage, and wherein the method is characterized by introducing a pre-disturb and/or post-disturb cycle before and after the disturb generating operation cycle respectively, during which cells along unaddressed word lines receive non-switching voltages and at least some non-zero voltages, producing pre- and/or post-disturb cell voltage pulses in the respective pre- and/or post disturb cycle by keeping the potential difference between unaddressed word lines and the addressed word line equal to or less than twice the magnitude of the coercive voltage, selecting the selected bit line potentials and non-selected bit line potentials such that the difference to the unaddressed word line potential is less than the magnitude of the coercive voltage and selecting the addressed word line potential such that the addressed cells only may receive voltages with magnitudes larger than the coercive voltage in the direction of the polarization state already set in the addressed cells.

2. A method according to claim 1, characterized by the voltage pulse protocol using a one-third ($V_s/3$) selecting rule for the potentials on word lines and bit lines.

3. A method according to claim 1, characterized by separating the potentials of the unaddressed word lines from the addressed word lines while producing the pre- and/or post-disturb pulses.

4. A method according to claim 1, characterized by producing at least one pre- and/or post-disturb pulse on the unaddressed cells that is of opposite polarity to the disturb pulses formed on same cells during the disturb generating operation cycle by setting the potential of the selected bit lines and/or the potential of the non-selected bit lines lower than the potential of the unaddressed word lines if the potential of the corresponding bit lines was higher than the potential of the unaddressed word lines during the disturb generating operation cycle, or setting the potential of the selected bit lines and/or the potential of the non-selected bit lines higher than the potential of the unaddressed word lines if the potential of the corresponding bit lines was lower than the potential of the unaddressed word line during the disturb generating operation cycle, and preferably selecting durations and amplitudes for the pre- and/or post disturb pulses produced on unaddressed cells such that the sum of the areas of pulses with positive polarity is substantially the same as the sum of the areas of pulses with negative polarity for all of the pulses applied on unaddressed cells in the disturb generating operation cycle and in the pre- and/or post disturb cycle.

5. A method according to claim 1, characterized by producing one pre- or post-disturb pulse on each unaddressed cell with substantially the same pulse area but of opposite polarity to the disturb pulse produced on the same cells during the disturb generating operation cycle with a pulse area of substantially the same size as the pulse area produced on the same cell during the disturb generating operation cycle but of opposite polarity, and preferably producing one pre-disturb pulse on each unaddressed cell with substantially the same magnitude and duration but of opposite polarity to the disturb pulse produced on the same cells during the disturb generating operation cycle, whereby single polarity voltage pulses for addressed cells in the direction of the polarization state already set in the addressed cells are produced by setting the addressed word line potential to be equal to or lower than the lowest bit line potential or equal to or higher than the highest bit line potential during application of the pre-disturb pulse.

6. A method according to claim 1, characterized by producing different durations for the pre- and/or post-disturb pulses on unaddressed cells depending on the type of bit line (BLx or BLy) by setting the bit line potential of the unaddressed cells that shall have the shortest pulse duration to be equal to the unaddressed word line potential for at least a part of the pre-disturb cycle.

7. A method according to claim 1, characterized by producing one post-disturb pulse on each unaddressed cell with substantially the same magnitude and duration but of opposite polarity to the disturb pulse produced on the same cells during the disturb generating operation cycle.

8. A method according to claim 1, characterized by producing one or more post-disturb pulses on unaddressed cells, each of the pulses having substantially less pulse area than any pulse produced on same cells during the disturb generating operation cycle, and at least one of the pulses having a polarity that is opposite to the last pulse produced on same cells during the disturb generating operation cycle, and preferably producing said one or more post-disturb pulses with substantially the same magnitude but with less duration than a pulse produced on the same cells during the disturb generating operation cycle.

9. A method according to claim 8, characterized by each of the one or more post-disturb pulses being 5–20 times smaller than any pulse produced on the same cells during the disturb generating operation cycle, and/or producing alternating positive and negative post-disturb pulses on unaddressed cells, and/or producing the post-disturb pulses with less pulse area than any preceding post-disturb pulse on same cells in same post disturb cycle, and/or that the last of the post-disturb pulses on unaddressed cells have the same polarity for all bit lines, whereby the potential of the unaddressed word lines and the potential of the addressed word line and the potential of one of the bit lines preferably are set to be equal when producing the last of the post-disturb pulses.

10. A method according to claim 1, characterized by producing time separated pre- and/or post-disturb pulses on unaddressed cells of one polarity at a time by setting either only the potential of the non-selected bit lines (BLy) or only the potential of the selected bit lines (BLx) to be equal to the potential of the unaddressed word lines, and at another instant of time setting only the potential of the other type of bit lines (BLx or BLy) to be equal to the potential of the unaddressed word lines, and preferably producing voltage pulses on addressed cells only in the direction of polarization state Y by setting the potential of the addressed word lines to be equal to the potential of the selected bit lines while producing the time separated voltage pulses, or producing voltage pulses on addressed cells only in the direction of polarization state X by setting the potential of the addressed word lines equal to the potential of the non-selected bit lines while producing the time separated voltage pulses.

11. A method according to claim 1, characterized by keeping the potential of the addressed word lines equal to the potential of the unaddressed word lines during at least a part of the post-disturb cycle while producing post disturb pulses.

12. A method according to claim 1, characterized by keeping the potential of the addressed word lines different from the potential of the unaddressed word lines during at least a part of the post-disturb cycle while producing post disturb pulses, and preferably producing pulses on addressed cells that always have greater magnitude in one direction by either setting the potential of the addressed word line closer to the highest potential of the bit lines while producing post-disturb pulses in the post-disturb cycle, or setting the potential of the addressed word lines closer to the lowest potential of the bit lines while producing post-disturb pulses in the post-disturb cycle.

13. A method according to claim 1, characterized by producing one or more pre- and/or post-disturb pulses that are not square-shaped and that between the beginning and end of each such pulse have a time-varying magnitude, and preferably with the pulses having a saw-tooth shape where the magnitude is decreasing and approaching zero.

14. A method according to claim 1, characterized by adjusting the shape of the pre- and/or post disturb-pulses depending on the proximity temperature, and preferably by increasing the duration of the pulses with increasing temperature.

15. A method according to claim 1, characterized by setting inactive bit lines and inactive word lines in one or more passive matrices that are adjacent to the currently addressed passive matrix to the same potential as the unaddressed word line in the currently addressed passive matrix.

* * * * *